April 23, 1968 L. BERMAN 3,379,993
FREQUENCY SYNTHESIZER USING FREQUENCY CONTROL
BASED ON A NARROW BAND WITHIN
SPECTRUM OF HARMONICS
Filed Dec. 8, 1966
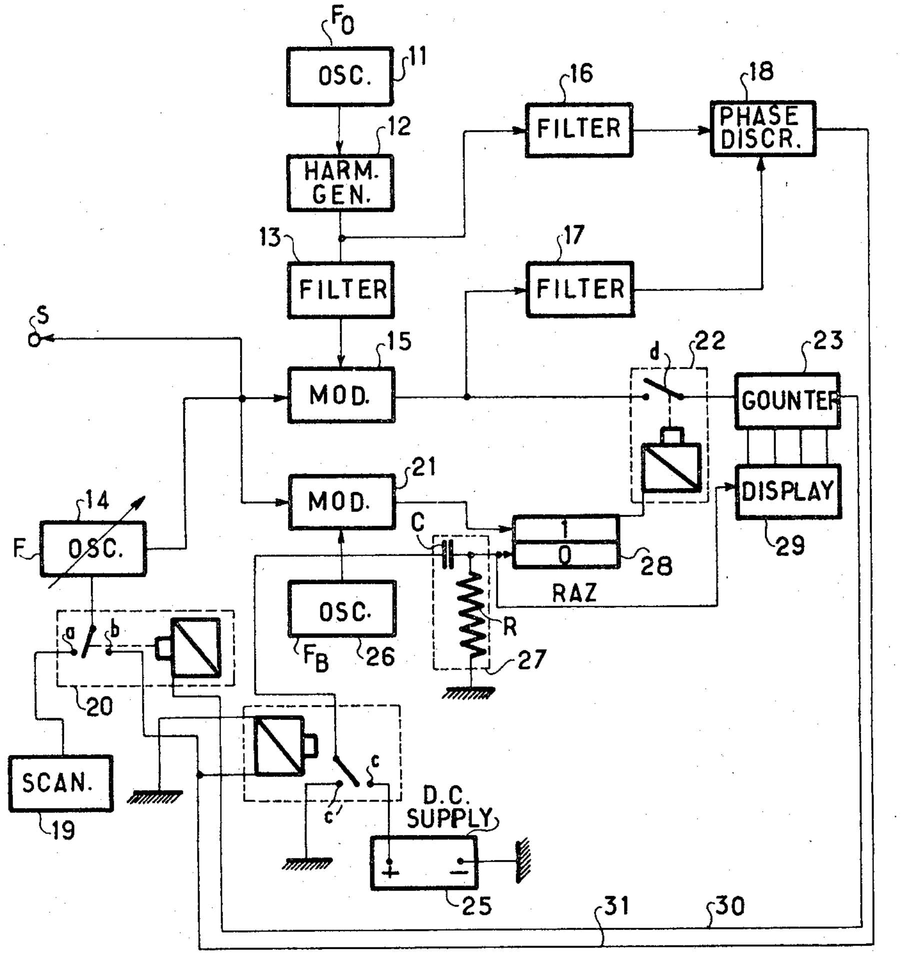

United States Patent Office 3,379,993
Patented Apr. 23, 1968

3,379,993

FREQUENCY SYNTHESIZER USING FREQUENCY CONTROL BASED ON A NARROW BAND WITHIN SPECTRUM OF HARMONICS

Léon Berman, Asnieres, Hauts-de-Seine, France, assignor to C.I.T.—Compagnie Industrielle des Telecommunications, Paris, France Filed Dec. 8, 1966, Ser. No. 600,166
Claims priority, application France, Dec. 8, 1965, 41,449
8 Claims. (Cl. 331—4)

ABSTRACT OF THE DISCLOSURE

This application discloses a frequency synthesizer wherein the means for generating an error control signal for regulating the output frequency of the synthesizer is operated at a fixed frequency due to connection in both input lines of the discriminator of a narrow-band filter having a pass band centered about the fixed frequency.

The present invention relates to a frequency synthesizer whose output is regulated by an error signal to a frequency determined by counting the beat pulses of modulated harmonic frequency waves derived from a fixed frequency furnished by a high-stability oscillator, the counting being carried on in a pulse counter in which there is posted a desired frequency in the form of a numerical value corresponding to the counting order or numerical range of the harmonic corresponding to the frequency selected. For an apparatus of this type the present invention proposes improvements which make it possible to considerably extend the operating range thereof.

A synthesizer of the type indicated above operates commonly in two stages. In a first stage, a variable frequency oscillator is controlled to produce an output frequency variation across a given range of frequencies. In the course of this scanning, the variable frequency is applied to a mixer which furnishes a beat successively with the harmonic frequencies contained in a spectrum, which is called the "directing spectrum," being generated at a fixed rate by a harmonic generator synchronized by a high-stability oscillator. A counter advances by one unit count upon receipt of each of these beats representing the position of successive harmonic frequencies in the band. In a second stage, when the counter has reached a value of "1" starting from an inserted predetermined value, it emits a signal whose effect is to put an end to the frequency scanning and to regulate by servo-control the frequency of the variable oscillator to a frequency which corresponds to the harmonic of the directing spectrum whose numerical order in the spectrum or range is equal to the numerical value posted in the counter. The variable oscillator will then furnish a pure frequency which is synchronized to the predetermined radiation of the directing spectrum, and this pure frequency thus has the same stability as the high-stability oscillator which serves to produce the directing spectrum.

In order to give this method its practical value, it is necessary to begin counting of the harmonics not during the course of one frequency scan but at the beginning of the scan since the start may fluctuate from one scan to the next by a frequency variation equal to several counting steps. Thus, it is necessary to begin counting only after passing over to a stable frequency which is called the "terminal frequency" in the spectrum.

In the stage providing servo-control, it is known to subordinate the frequency issued from the variable oscillator to a stable frequency having an equal value to that furnished by a directing spectrum with the aid of an element called a "frequency discriminator" which receives, on a first pair of terminals, the frequency produced by the variable oscillator and, on a second pair of terminals, a high-stability frequency extracted from a directing spectrum having a value equal to the preceding one. The discriminator furnishes a direct current output voltage which is applied to the variable oscillator as a servo-control of the frequency generated thereby, and most often as a polarized error voltage applied to a variable capacity diode ("varactor") contained in the variable oscillator, the same variable capacity diode being utilized generally for carrying out the frequency scanning.

It has been proposed that such a frequency discriminator be made to operate within a wide range, either in the entirety of the range covered by the variable oscillator, or in a major or substantial portion thereof.

This is a serious drawback since such an element does not have uniform operating characteristics within such a wide range. The result thereof is that, if there are optimum servo-control characteristics for a narrow band of frequencies, the quality or stability of the servo-control decreases on both sides of said band. It follows therefrom that, in order to maintain a high quality for the servo-control, one is led to have such a device cover a relatively narrow range, which makes it necessary to multiply the number of elements so as to cover the wide range.

In accordance with the present invention, there is provided in a frequency discriminator of the type described above, means for causing said frequency discriminator to operate at a fixed reference frequency, which means consist of a first narrow-band filter having a band width narrower than two counting steps and centered on said reference frequency. This first filter is connected between the output of the directing spectrum and a first input of the phase discriminator. There is also provided a second narrow-band filter identical in design to the aforementioned filter, which is connected between the output of a modulator serving for mixing the frequency of the variable oscillator and the directing spectrum and a second input of the discriminator, the direct voltage being furnished by the phase discriminator which operates at the reference frequency applied by servo-control to an oscillator which operates on a different frequency.

By virtue of this provision, a frequency synthesizer may be caused to operate on a frequency range of considerable width. With the aid of a known process of frequency addition, it is possible to connect several servo-control loops, each having an operating range which is relatively wide, with the result that one may actually achieve operation of a frequency synthesizer within a range of virtually any width.

It is a general object of the present invention to provide a frequency synthesizer which eliminates or otherwise substantially avoids the disadvantages inherent in known arrangements of a similar nature.

It is another object of the present invention to provide a frequency synthesizer of the type described which is capable of operating at maximum efficiency over a wide frequency range.

It is a further object of the present invention to improve the operating efficiency of frequency synthesizers of the type described by relatively simple and economic means.

These and other objects, features and advantages of the present invention will become more apparent from the following detailed description thereof when taken with the accompanying drawings.

The present invention will now be described in detail on the basis of the accompanying drawing, the single figure of which illustrates one exemplary embodiment thereof. More particularly, elements for forming variable circuit connections have been illustrated therein in the form of electro-mechanical relays, although in actual practice they will preferably be made by means of semiconductor components.

A high-stability oscillator 11 having an output frequency $F_0$ excites a harmonic generator 12 furnishing in arithmetic progression a 'directing spectrum' the upper limit of which is at the cut-off frequency of a high-pass filter 13 connected to the output of the generator 12 in order to eliminate any possibility of false regulation. The output of filter 13 is applied to the input of a first modulator 15 which receives on another input a variable frequency F furnished by an oscillator 14. The variable frequency output of oscillator 14 effectively sweeps across the spectrum of harmonic frequencies derived from harmonic generator 12 in the modulator 15, producing an impulse at the output of the modulator as each harmonic frequency is passed. This operation is based on the well-known principle that the amplitude of a modulated signal resulting from the mixing of two signals of similar frequency varies with the phase of the signals. The output current of said modulator 15 is applied through a relay contact *d* of a relay 22 to an input terminal of an electronic counter 23 to which is also applied a predetermined counting value via a display recorder 29. It is assumed that this counter counts by going from a pre-set value A to the value "1," and that, upon arriving at the specific count of "1," it emits a signal on output line 30.

A band-pass filter 16 having a narrow band centered on a reference frequency $F_R$, which is lower than the cut-off frequency of the high-pass filter 13, is inserted between the output of the harmonic generator 12 and an input of a phase discriminator 18. Another band-pass filter 17, being in principle identical to the aforementioned filter 16, is inserted between the output of said modulator 15 and a second input of said phase discriminator 18.

The frequency F generated by the oscillator 14 is also applied to an input of a second modulator 21 which receives on another input a fixed, or terminal, frequency $F_B$ furnished by an oscillator 26. The output of this modulator 21 is connected to an input of a bi-stable flip-flop 28 whose output is connected to relay 22. The oscillator 14 also furnishes the frequency F on an output terminal S.

The oscillator 14 may be subjected to the control of a scanning device 19 providing a sweep voltage output or else the oscillator 14 may be controlled by a servo-control voltage derived from the phase discriminator 18 by way of a line 31. The type of control provided depends upon the position *a* or *b* of a contact of a relay 20 connected thereto. The relay 20 is controlled by way of a line 30 from the output of the counter 23. A relay 24 having a fixed contact *c* is controlled by the output current of the phase discriminator 18 via line 31. A direct current source 25 is connected to a fixed contact *d* of said relay 24, which selectively connects the voltage source to a shunt element 27 comprising a condenser C in series and a resistance R in shunt. In order to return the relay 24 to the rest position thereof, circuit 27 furnishes a pulse to reset the flip-flop 28 and the display recorder 29 to zero.

OPERATION

At the beginning of a frequency exploration with scanning 19 connected to oscillator 14, the beat pulses at the output of modulator 15 resulting from modulation of the variable frequency F with the harmonics of the directing spectrum derived from harmonic generator 12 via filter 13 are not applied to the counter 23 since the switch *e* of relay 22 is open. When the variable frequency F reaches the terminal frequency $F_B$ generated by oscillator 26, modulator 21 will produce an output switching the flip-flop 28 to its longical "1" state thereby actuating the relay 22 to close switch *e* thereof. From this moment on, the beats at the output of modulator 15 are counted in the counter 23. When the counter arrives at the value "1", it operates the relay 20 by way of line 30 and the frequency exploration is stopped due to disconnection of the scanner 19. The output error voltage of the phase discriminator 18 is then applied to the oscillator 14 in control thereof through the line 31 and the contact *b*.

The phase discriminator 18 is supplied at the instant, on the one hand, with a high-stability reference frequency $F_R$ forming part of the spectrum coming directly from the harmonic generator 12 via filter 16 and, at the same time, with a frequency produced at the output of modulator 15 via filter 17. The frequency F (which is actually nominally equal to one of the frequencies of the directing spectrum) is transposed by another harmonic contained in the directing spectrum. One is certain to find in the spectrum of the harmonic generator the frequency necessary for furnishing the transposed frequency $F_R$ starting from the frequency F.

When the relay 24 is energized, its movable contact is at *c*. If, for any reason at all, the synchronism in the system is lost, the relay 24 will be de-energized and the source 25 will be connected to the shunt circuit 27 via contact *d* of relay 24. The shunt circuit 27 will produce a pulse for resetting flip-flop 28 to zero, which re-inserts the posted value A in the counter 23 via display recorder 29. The result thereof is the deenergizing of the relay 20, and the start of another frequency exploration by the connector of scanner 19 through contact *a* of the relay to oscillator 14 once again.

It is understood that numerous modifications are possible within the framework of the present invention, the principle thereof being essentially the operation of the means for generation of the servo-control signal at a fixed frequency.

I claim:

1. In a frequency synthesizer comprising a variable frequency oscillator, a frequency scanning device connected to said variable oscillator in control thereof and a high-stability oscillator connected to the input of a harmonic generator providing a spectrum of harmonics in arithmetic progression each defining one counting step, the output of said variable generator and of said harmonic generator being connected respectively to two inputs of a modulator whose output is connected to a pulse-counting means for counting the steps of said harmonics, said counting means comprising a means responsive to a pre-set count for stopping scanning and for connecting said variable oscillator to a servo-control means whose output is applied to said variable oscillator to produce a high-stability output frequency, the improvement consisting essentially in said servo-control means comprising a phase discriminator, one of the inputs of which is connected to the output of the harmonic generator by means of a first narrow-band filter having a band width narrower than two counting steps, and the other input of which is connected to the output of said modulator by means of a second narrow-band filter having the same band pass as said first filter.

2. The combination defined in claim 1, wherein the pass band of said first and second filters is centered about a reference frequency forming one of the harmonics of said spectrum of harmonics.

3. The combination defined in claim 2, wherein said reference frequency falls within the range of maximum efficiency of said phase discriminator.

4. In a signal processing circuit for producing an output signal of highly stable frequency including a variable frequency oscillator, a fixed frequency oscillator producing a fixed frequency signal of high-stability, a harmonic generator connected to said fixed frequency oscillator for producing a spectrum of harmonics of said fixed frequency signal, modulator means connected to both said variable oscillator and said harmonic generator for mixing the outputs thereof, and servo-control means connected to said harmonic generator and said modulator means for producing an error signal for control of said variable frequency oscillator, the improvement essentially consisting of means for basing the operation of said servo-control means solely on a narrow band of frequencies within said spectrum of harmonics.

5. The combination defined in claim 4, wherein said servo-control means includes a phase discriminator having a first input connected to the output of said harmonic generator and a second input connected to the output of said modulator means, said phase discriminator having its output connected to the input of said variable frequency oscillator in control thereof.

6. The combination defined in claim 5, wherein said means for basing the operation of said servo-control means solely on a narrow band of frequencies includes first and second narrow-band filters having a band width narrower than twice the separation between said harmonics, said filters being connected respectively between said phase discriminator and said harmonic generator and said modulator means.

7. The combination defined in claim 6, wherein the pass band of said first and second filters is centered about a reference frequency forming one of the harmonics of said spectrum of harmonics.

8. The combination defined in claim 7, wherein said reference frequency falls within the range of maximum efficiency of said phase discriminator.

No references cited.

JOHN KOMINSKI, *Primary Examiner.*